United States Patent [19]

Moore

[11] Patent Number: 4,542,508

[45] Date of Patent: Sep. 17, 1985

[54] AMENABLE LOGIC GATE AND METHOD OF TESTING

[75] Inventor: Donald W. Moore, Los Angeles, Calif.

[73] Assignee: Aerojet-General Corporation, La Jolla, Calif.

[21] Appl. No.: 553,571

[22] Filed: Nov. 21, 1983

[51] Int. Cl.[4] ............................................. G01R 31/28
[52] U.S. Cl. .................................. 371/29; 324/73 R; 371/15; 371/20
[58] Field of Search ....................... 371/15, 20, 25, 21, 371/29; 364/716; 307/465; 340/825.83; 324/73 R

[56] References Cited

U.S. PATENT DOCUMENTS

| | | | |
|---|---|---|---|
| 3,783,254 | 1/1974 | Eichelberger | 364/716 X |
| 3,958,110 | 5/1976 | Hong et al. | 371/15 |
| 4,225,957 | 9/1980 | Doty, Jr. et al. | 371/15 |
| 4,380,811 | 4/1983 | Gotze et al. | 371/20 X |
| 4,435,805 | 3/1984 | Hsieh et al. | 371/25 |

*Primary Examiner*—Charles E. Atkinson
*Attorney, Agent, or Firm*—Leonard Tachner

[57] ABSTRACT

A multiple input logic gate that is amenable to full testability without the "buried logic" problem of conventional VLSI logic devices and a novel dynamic test method for increasing fault-free production and simplified analysis of sub-chip faults. In one disclosed illustrative embodiment of the logic gate of the invention, the device comprises a replicated, hierarchial arranged group of six two-variable input gates to form a three-variable input gate and two such three input gates and associated logic control structure are provided on a single VLSI integrated circuit chip. Each two-variable input gate is controlled by its own programmed logic array thereby providing a selection of any of the possible 256 Boolean functions for each of the three-variable input gates on a chip. A highly advantageous dynamic test method exploits the regular hierarchial architecture of the inventive logic gate to provide top-down evaluation of each two-variable input gate until the six-gate structure is fully tested. The test method is implemented by clocking the two-variable input gates through their respective sixteen Boolean function sequentially and displaying a video map of gate output signals which will conform to a specified pattern when the device is fault-free.

30 Claims, 17 Drawing Figures (1,1)    (0,1)    (0,0)    (1,0)

(1,1)    (0,1)    (0,0)    (1,0)

(1,1)    (0,1)    (0,0)    (1,0)

(1,1)　　(0,1)　　(0,0)　　(1,0)

(1,1)　　(0,1)　　(0,0)　　(1,0)

AMENABLE LOGIC GATE AND METHOD OF TESTING

BACKGROUND OF THE INVENTION

1. Field of the Invention

This invention relates generally to the field of state machine logic and more specifically, to a modular, fully testable, multiple input gate in the form of a high speed low power field programmable logic array in which all internal logic components can be fully tested in a simple and highly expedient manner.

2. Prior Art

The desirability of an integrated circuit logic device which can realize any logical function of a fixed number of variables is well-known in the art. The capability of a logic device for implementing all possible Boolean functions of its variables is in this description called "completeness". For a gate with N input variables, the number of different Boolean functions is equal to 2 raised to the power 2 to the power N. A gate would therefore be complete if it can be set to any of this set of logic functions. Gates with similar properties have been called universal, however, this term usually means that all the set of such functions can be accommodated with a given set of gates. Thus, universal is more term on the level of applications, i.e., which or how many functions can be implemented. Completeness is a term about capabilities and the relevant parameter is the number of input variables not the maximum number of functions. Universal logic circuits are discussed in prior art literature including an article entitled "Universal Logic Circuits and Their Modular Realizations" by S. S. Yau and C. K. Tang at pages 297–305 of the 1968 Spring Joint Computer Conference proceedings. The desirability of producing a multipurpose logic circuit for performing all or virtually all discrete logical combinations of a given number of variables, has resulted in a number of relevant prior art patents. For example, U.S. Pat. No. 3,428,903 to Forslund et al discloses a logic block said to be capable of performing 254 out of 256 discrete logical combinations of three variables and an earlier patent to the same inventors, namely, U.S. Pat. No. 3,381,117 discloses a particular logic circuit embodiment which is said to be capable of performing all 256 logic functions of a three input device. The following additional patents are deemed to be relevant in varying degrees to the completeness feature of this invention:

U.S. Pat. No. 3,987,286, Muehldorf;
U.S. Pat. No. 4,034,356, Hawley, et al.;
U.S. Pat. No. 4,053,793, Ernst, et al.;
U.S. Pat. No. 4,292,548, Suarez, et al.;
U.S. Pat. No. 4,336,601, Tanaka;
U.S. Pat. No. 4,348,737, Cukier, et al.

An important aspect of all logic circuits, whether or not complete, is the ability to test all of the contained logic fully and expediently. Full testability is obviously desirable as it provides the only way of being sure that a component is absolutely fault-free. However, with the advent of VLSI integrated circuit chips, the equivalent of hundreds of thousands of transistor circuits are located within one chip. As a result, the internal logic components of the chip lose external accessibility, causing what has come to be known as "the buried logic problem" of VLSI chips. This problem can be particularly troublesome for multiple input variable complete logic gates theoretically capable of a great number of Boolean functions. The desirability of expedient testing is further justified in view of the substantial "bottom line" contribution that complex test equipment and expensive and time consuming testing expertise can make to the ultimate cost of the chip.

In order to fully test a complex logical gate circuit it is necessary to interrogate each component or node of the circuit to obtain reliable information about the state of that node. Typically, it consists of manipulating all or part of the lines of the gate in such a way that partial or complete conclusions about the node can be made. One can, for example, use all data lines, that is, input variable lines as well as control lines and generate all possible combinations of the logical states. This is an exhaustive test of the integrity of the gate allowing one to be sure that the gate matches the functional specifications. Consider for instance a complete gate with L lines comprising N variables and 2 to the power N control lines. If one considers this node as a fixed gate, testing must be done by exhaustively sequencing through all possible combinations of variables and control lines and checking whether the output matches the specification. This scheme therefore involves 2 to the power L steps. Alternatively, one may exploit the functional difference between the variables and the control lines, for example, by sequencing the control lines through all possible states. Then by examining the output, one can deduce some or complete information regarding the values of the input variables. Equivalently, sequencing the input variables through all possible states will generate at the output the entries of the true table of the function selected by the control lines.

The disadvantages of conventional testing of combinatorial logic circuits and one proposed solution are discussed in an article entitled "Syndrome-Testable Design of Combinational Circuits" by Jacob Savir at pages 442–451 of the June 1980 I.E.E.E. Transactions on Computers, Volume C-29, No. 6. Although this article discloses a testing method which is far simpler than previous prior art test techniques for logic circuits, the method disclosed requires increasing the number of pins around the circuit and more importantly, merely provides the test result of indicating a fault without indicating the likely cause and location of the fault. The most relevant art known to the applicant in the form of previously issued patents is the patent to Eichelberger U.S. Pat. No. 3,761,695 which discloses the concept of testing generalized modularized logic systems utilizing dynamic measurements of logic networks that are buried within a particular logic package and employing a scan-in/scan-out capability. These scan-in/scan-out operations are described as being independent of the system input and output control signals and would thus seem to simplify the test process. However, the patent describes a separate test system of relatively complex requirements including all the steps of a comprehensive method noted in FIG. 8 of that patent. Perhaps more significantly, the patent describes a test process which requires that the logic device being tested have special access lines for the test process thereby incurring the penalty of an increase in the number of pins; the same penalty described by Savir in his Syndrome-Testable Design article.

In summary, none of the prior art known to the applicant discloses logically complete modules or atoms in an array especially configured to achieve transparent and fully testable decomposed states and full array testability that solves the buried logic problem of VLSI circuits.

SUMMARY OF THE INVENTION

The logic device of the present invention performs computational logic functions suitable to concurrent or serial logic machines. It applies to any computer application in which reliability and testability is a requirement. It possesses a number of highly advantageous features including full testability that solves the aforementioned VSLI buried logic problem. More importantly, it may be tested with reduced test complexity which is linearly related to the number of logic nodes as opposed to being exponentially related to the number of logic nodes which is characteristic of conventional devices. The invention is logically flexible in that it has features essential to a learning machine and is adaptable to parallel or serial machines thus overcoming the limitations of fixed logic arrays. The invention is field programmable in that it can be programmed by the user to suit the user's application while having none of the computational speed or power consumption penalties of conventional field programmable logic arrays. Furthermore, the invention can be manufactured and completely tested as a standard, high volume VSLI product having the advantages of high speed and low power consumption.

In one illustrative embodiment of the present invention the logic structure is a combinatorial logic device in the form of a complete gate structure. The device is a three input gate constructed from six two-variable input gates. The device architecture has a regular structure with a hierarchial form. The general purpose quality of the device is derived from the ability of the gate structure to be configurable into all of the possible 256 functions of a three input device. The embodiment is therefore complete in the sense that it can assume any and all possible Boolean functions by a combinatorial device with two or three inputs. The structure is composed of six two-variable input gates called nodes or atoms. Each input gate is identical and is in itself complete. At the two input level, completeness means the ability to recognize all sixteen possible logic functions for two inputs. The multiple logic states that a node or atom can assume are selected by a control structure in the form of a four-bit control word. When the atom is used as a combinational logic device, a fixed control word establishes the desired function. At this level of control a simple scheme is available for structuring field programmable logic arrays (FPLA) with qualities of speed and normal power. On the other hand, conventional FPLA design establishes logical options by incorporating in the data path all of the expected logic options and blowing fuses to select specific options. The resultant loading on the data path degrades performance. The atom maintains a parsimonious data path and appends the control structure. Control structure design is independent of data path quality features. The atom may be arranged in structures that provide for inputs greater than two in other embodiments. Testability is provided by modifying only the control structure. The test algorithm may be incorporated for each atom or for all atoms via a four-bit bus from a central test location in a memory device. The test algorithm contains sixteen control words of four bits each that explore the sixteen logic options of a complete atom. A test would exploit the four logic states as trivial to gain observability at various input states. The complexity of the test procedure grows linearly with the number of atoms and may be contrasted with procedures that exercise the input ports and grow approximately as the square of the number of atoms.

The invention herein disclosed also comprises a dynamic test method which is deemed to be a powerful new approach to the evaluation of gate structures. The regular hierarchial architecture of the embodiment permits top-down evaluation of each atom until the six node structure is completely tested and verified. The test is implemented by a microprocessor controller and a frequency spectrum detector that permit the use of pattern recognition of a pulse frequency spectrum to verify logical correctness. As a result of the novel test method and gate structure of the present invention, the capability of the invention to provide all 256 possible logic states of a three input array is evaluated by only 24 inspections to reveal the entire logical profile of the device.

OBJECTS OF THE INVENTION

It is therefore a principal object of the present invention to provide a combinatorial logic device which is amenable to full testability and which, irrespective of the technology in which it is implemented including VLSI, can be completely tested while overcoming the conventional "buried logic" problem of the prior art.

It is an additional object of the present invention to provide a state machine logic device which may be completely tested by a novel test method which significantly reduces the longevity and complexity of the test while still assuring functional assessment of all logic components contained therein.

It is still an additional object of the present invention to provide a novel test method for combinatorial logic devices which method is especially suitable for testing a field programmable multiple input variable logic gate which may be complete in that it provides for selection of any of the possible Boolean functions for the number of inputs.

BRIEF DESCRIPTION OF THE DRAWINGS

The aforementioned objects and advantages of the present invention as well as additional objects and advantages thereof will be more fully understood hereinafter as a result of a detailed description of a preferred embodiment of the invention when taken in conjunction with the following drawings in which.

DETAILED DESCRIPTION OF A PREFERRED EMBODIMENT

Figure 1:
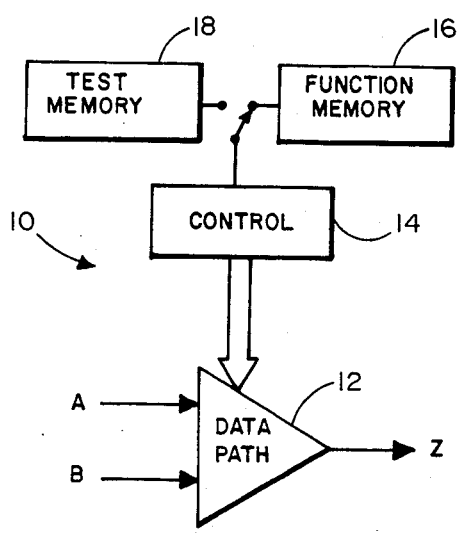
FIG. 1 is a block diagram of a unitary node or atom of the invention configured for test or function as selected by a user.

FIG. 1 is a basic building block or atom 10 of the logic network of the invention. It is a six input device comprising two variable data inputs and four control line inputs. Consequently, it is a complete logic device, meaning that it has the maximum computing power for two input variables. In the symbolic block diagram of FIG. 1 atom 10 comprises a data path 12, a control apparatus 14, a function memory 16 and a test memory 18. Input variables A and B are applied to data path 12 which in turn produces an output Z. The output Z is a Boolean function of the input variables A and B determined in accordance with the output of control apparatus 14. Control apparatus 14 provides four control lines carrying a selected combination of four binary signals which determine the Boolean function of data path with respect to the input variables A and B. The provision of four such control lines from control apparatus 14 permits the application of sixteen binary combinations to data path 12 thereby allowing data path 12 to assume all possible sixteen Boolean functions for two input variables. These sixteen Boolean functions are listed in an represented by the Karnaugh Map shown in Table 1.

TABLE I

| BOOLEAN EXPRESSION | KARNAUGH MAP | C3 | C2 | C1 | C0 |
|---|---|---|---|---|---|
| 0 | | 0 | 0 | 0 | 0 |
| X1 · X2 | | 0 | 0 | 0 | 1 |
| X̄1 · X2 | | 0 | 0 | 1 | 0 |
| X2 | | 0 | 0 | 1 | 1 |
| X1 · X̄2 | | 0 | 1 | 0 | 0 |
| X1 · X2 + X̄1 · X̄2 | | 0 | 1 | 0 | 1 |
| X̄1 | | 0 | 1 | 1 | 0 |
| X̄ + X2 | | 0 | 1 | 1 | 1 |
| X1 · X̄2 | | 1 | 0 | 0 | 0 |
| X1 | | 1 | 0 | 0 | 1 |
| X1 · X̄2 + X̄1 · X2 | | 1 | 0 | 1 | 0 |

TABLE I-continued

| BOOLEAN EXPRESSION | KARNAUGH MAP | C3 | C2 | C1 | C0 |
|---|---|---|---|---|---|
| X1 + X2 | | 1 | 0 | 1 | 1 |
| X̄2 | | 1 | 1 | 0 | 0 |
| X1 + X̄2 | | 1 | 1 | 0 | 1 |
| X̄1 + X̄2 | | 1 | 1 | 1 | 0 |
| 1 | | 1 | 1 | 1 | 1 |

As seen in FIG. 1 the actual control apparatus output may be controlled by either a function memory 16 or a test memory 18. Typically the function memory 16 places control apparatus 14 in a suitable control mode for providing data path 12 with a selected Boolean function for input variables A and B. However, function memory 16 may be selectively re-programmed as required to change the output of control apparatus 14 in accordance with an alternative selection for the Boolean function of data path 12. On the other hand, test memory 18 would typically be provided with capability for cycling control apparatus 14 through all possible control signal combinations in a sequential fashion for the purpose of generating all Boolean functions for data path 12 during a test of the atom 10.

Figure 2:
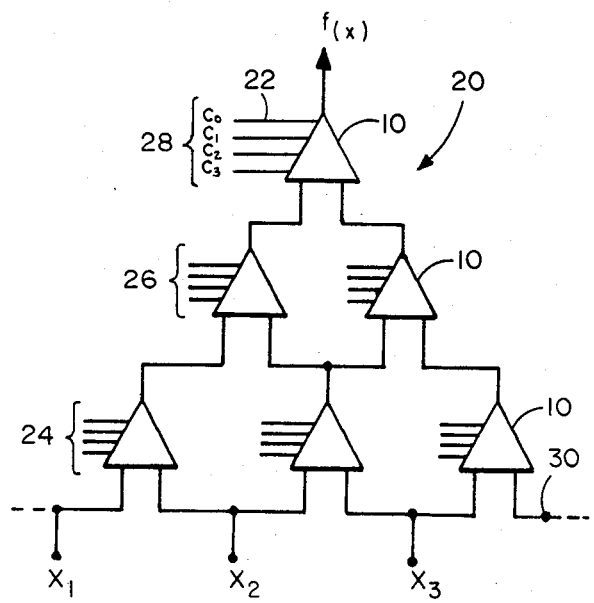
FIG. 2 is a schematic block diagram of a three variable input gate structure embodiment of the invention utilizing six of the atoms or nodes of FIG. 1.

Referring to FIG. 2 there is shown therein an illustrative general purpose gate 20 which is a combinatorial logic device in the form of a complete gate structure. The device is a three-variable input gate structured from six two-variable input gates or atoms 10. The device architecture has a regular structure with a hierarchial form. The general purpose quality of the device derives from the ability of the gate structure to be configurable into all of the possible 256 truth-table values of a three input device. The gate structure 20 is thus "complete" in the sense that it can assume any and all possible Boolean functions as a combinatorial device with three inputs. As previously discussed in conjunction with FIG. 1, each two-variable input gate or atom 10 is identical and is in itself complete. The bottom tier 24 of atoms 10 comprises three such atoms which are adapted to receive input variables X1, X2 and X3 and provide connection to the next highest tier 26 of two atoms 10 which is in turn connected to a highest tier 28 of a single atom 10. The output signal of single atom 10 comprising tier 28 is f(x), a Boolean function of the three input variables X1, X2 and X3. It is to be noted that the right-most input line 30 of the right-most atom 10 of tier 24 is connected to the left-most input line of the left-most atom 10 of that tier to provide for three input variables. It is also to be noted that each atom 10 includes provision for four control lines C0, C1, C2 and C3. Each such set of control lines is connected to a source of control code signals. This feature is discussed hereinafter in conjunction with FIG. 3.

Reference will now be made to FIGS. 3-6 for a more detailed description of an actual integrated circuit implementation of one illustrative embodiment of the present invention. More specifically, referring first to FIG. 3 it will be seen that the actual implementation of each atom or two-variable input gate structure of the present invention comprises a logical unit 40, a decode programmable logic array (PLA) 42, a static shift register (SSR) 44, and a two phase clock generator 46.

Figure 4:
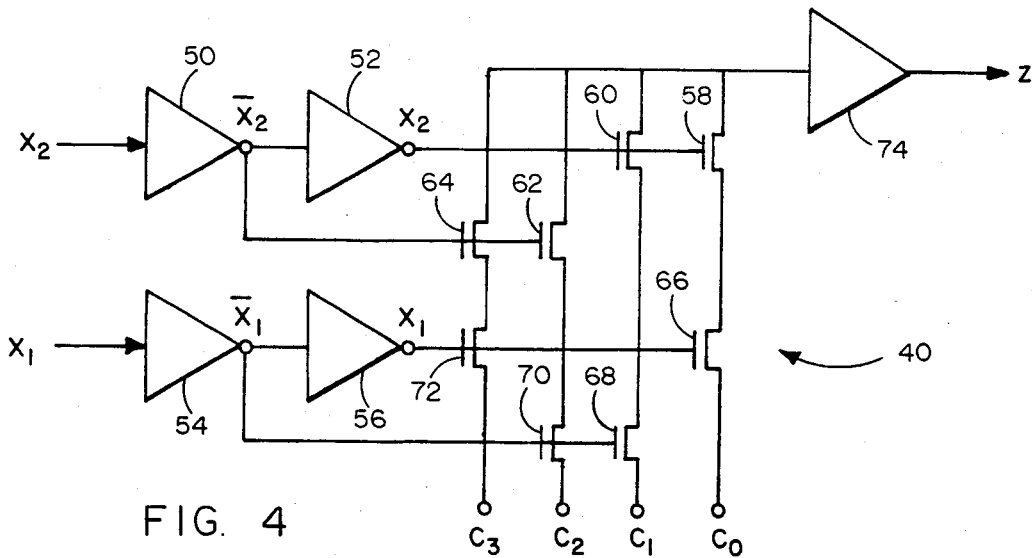
FIG. 4 is a schematic diagram of a specific gate structure of a node or atom of the present invention shown in accordance with a preferred embodiment that has been reduced to practice.

Logic unit 40 is shown in detail in FIG. 4. As seen in FIG. 4 the logic unit 40 is driven by inverting supper buffers 50, 52, 54 and 56 and a non-inverting super buffer 74 to ensure maximum speed in the input/output logic circuit. Each of the inverting input buffers drives the gate of each of two field effect transistors (FET). Control signals C0–C3 provide the source voltages and the drains are tied either serially or directly to common input/output super buffer 74. In this manner the logic condition of the control signals C0–C3 determines which one of the possible Boolean functions of input variables X1 and X2 will produce the Z output. Thus, for example, if only C0 were in a logical one condition and the remaining control signals were all at logical zero conditions, Z would attain a logic one state only if both X1 and X2 input variables were at a logical one state. Therefore, in this condition, logic unit 40 would act as an AND gate. On the other hand, if control signals C0, C1 and C3 were in a logic one condition and only C2 were in a logic zero condition, the Z output would be in a logic one condition if either X1 or X2 or both were in a logic one condition. Therefore, in this mode of control, logic unit 40 would behave as an OR gate. Whenever the control signals C0–C3 are fixed, the logic unit is the only portion of the atom implicated in signal handling.

Control signals for the logic unit 40 are derived from a static shift register 44 and a programmed logic array 42. This combination provides a means to change the control signal and to remember the last signal, thus comprising a form of memory. SSR 44 comprises up to eight register segments and so may be shifted sequentially into eight states by a clock signal CLK. The eight states are decoded by the PLA 42 into sixteen unique signals for sixteen clock transitions by a NAND portion of the PLA. A NOR portion of the PLA 42 converts the sixteen signals out of the SSR 44 into as many four-bit binary words that act as the control signals for the logic unit. SSR 44 is a conventional device comprising sixteen inverting super buffers arranged in a ring with the output of the last stage being inverted to be looped back to the SSR input. Each inverter drives an input to the PLA NAND section. In this manner, the SSR provides the needed complements to the eight inverter segments. The pass-transistors that operate the register of SSR 44 are clustered at the input to each segment. In this way, the speed of the circuit is improved and the hazard of faulty logic due to capacitive voltage is minimized.

The PLA is sparsely populated with transistors; i.e., only two per inverter signal (32 total). This low population permits distribution of the transistors toward the drive parts and reduced PLA capacitance. A non-overlapping clock utilizes the capacity of two distribution buses CLOCK and NON-CLOCK to slow clock transitions in proportion to the chip distributed capacity ensuring that all the register gates are at correct potentials during shifting. This precaution is included to avoid "racing" in the SSR. The clock generation circuit is a familiar two NOR gate five inverter design. Super buffers are used to drive the clock buses, provide somewhat equal rise and fall times and also facilitate a clock slowdown function.

Figure 3:
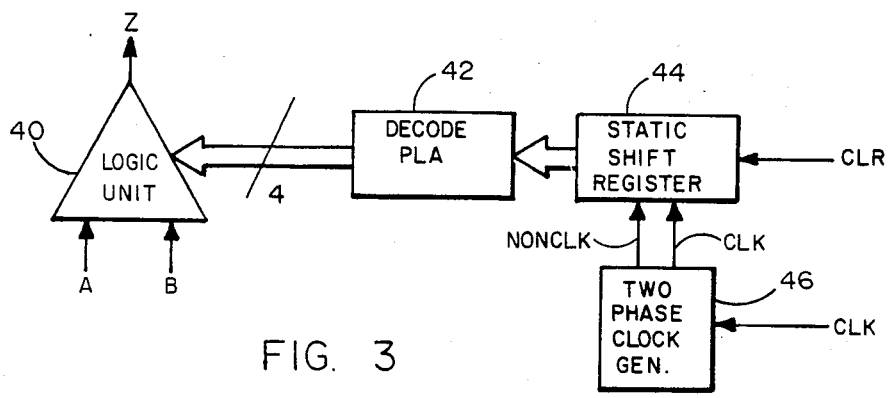
FIG. 3 is a block diagram of a node or atom of the present invention configured specifically in accordance with a preferred embodiment that has been reduced to practice.
Figure 5:
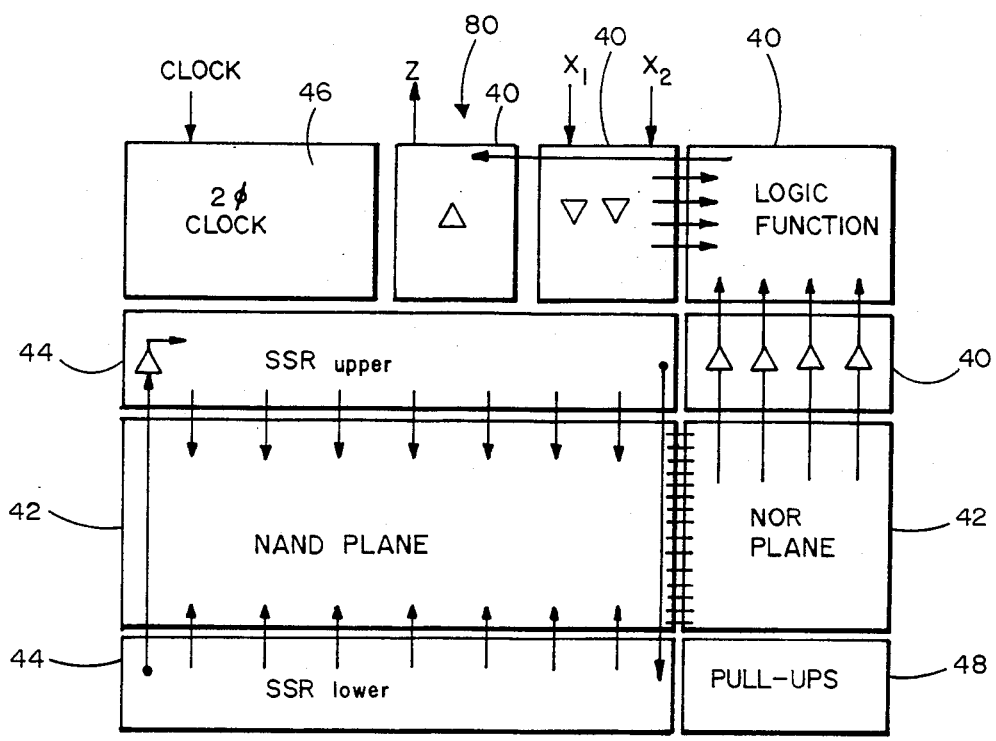
FIGS. 5 and 6 are floor plan layout drawings respectively of an atom or node of the invention and of an entire chip incorporating dual sets of six such atoms.
Figure 6:
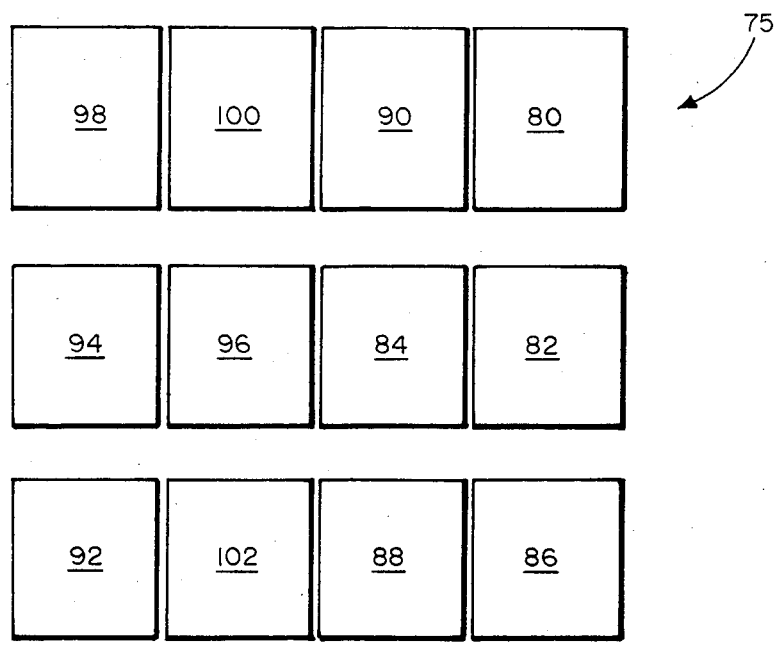

Floor plan drawings of the replicated two input atom 10 incorporating the SSR/PLA configuration of FIG. 3 and of an entire chip incorporating two complete gate networks 20 of FIG. 2, are shown respectively in FIGS. 5 and 6. The layout of gate 10 is determined largely by the PLA shape. PLA size is determined by the spacing of the super buffers and switching transistor networks that drive the PLA. The design of the chip floor plan is based upon the replication and interconnection of the basic two input gates in groups of six with two such groups being incorporated on a single chip. The resultant chip size is approximately 4×5 mils including 36 pads. As seen in FIG. 5 the reference numerals applied to the layout of the atom or two input logic gate indicate the correspondence between the floor plan location and the functional block discussed previously in conjunction with FIG. 3. The only portion of the floor plan of FIG. 5 not previously identified comprises a plurality of pull-up resistors 48 shown in the lower right-hand of that figure. Thus, the floor plan of the two input logic gate generally identified by reference numeral 80 as shown in FIG. 5, comprises four portions which make up the logic unit 40, two portions including a NAND plane and a NOR plane which make up PLA 42, two portions including an upper SSR portion and a lower SSR portion which make up static shift register 44 and a single portion which comprises the two phase clock 46 along with the previously mentioned pull-up resistors portion 48.

An entire gate is shown in FIG. 6 in the layout of a chip 75 wherein the two input gate portion 80 is located in the upper right-hand corner of the floor plan of the entire chip. Two input gate 80 forms the upper-most hierarchial chip of a first group comprising additional atoms 82, 84, 86, 88 and 90, which, in combination, provide a complete three-variable input logic gate structure as shown in FIG. 2. The chip 75 also comprises a second such three-variable input gate structure comprising atoms 92, 94, 96, 98, 100 and 102 with atom 92 forming the upper-most level of the hierarchial structure of that group.

THE METHOD OF TESTING

The three input gate structure forming one embodiment of the invention described above, is capable of performing 256 Boolean functions. The testability of this gate structure is one example of the inventive feature of the apparatus as claimed below. However, it will be understood that neither the amenable gate structure nor the novel test method is limited to the particular embodiment described nor to the particular number of inputs disclosed. Three testing methods have been considered. These three methods comprise the following: (1) static logic test as a three input gate; (2) static logic test as six two input gates; (3) static-dynamic logic test as six two input gates.

The first indicated method is a conventional approach of logic device testing and comprises the process of setting the three-variable input gate structure to the 256 Boolean functions available. The input bit pattern is varied through its eight possible combinations for each function. This approach requires 256×8 basic steps to verify the correct performance of the chip.

The second above-indicated testing method is available as a result of the specific architecture of the two-variable input gate and the fact that it is replicated six times to form the three-variable input gate; the commandable nature of each such two input gate; and the availability of trivial logical cases within each atom. This second method of tet is a static process that decomposes the structure into its nodes and tests each node individually. The regular replicated structure permits various test sequences. The top-down sequence allows each node to be evaluated individually, then that layer may be set into a transparent logical state with the output held equal to one of the two input logical states. Successive lower layers may then be evaluated and results may be monitored at the output. The three input gate has six nodes, each with sixteen selectable functions and two inputs. Thus a single node may be evaluated with 64 static steps. The entire three input gate structure would require 64 times 6 or 384 steps. Thus this method has approximately twenty percent of the number of steps of the first method indicated above.

Figure 7:
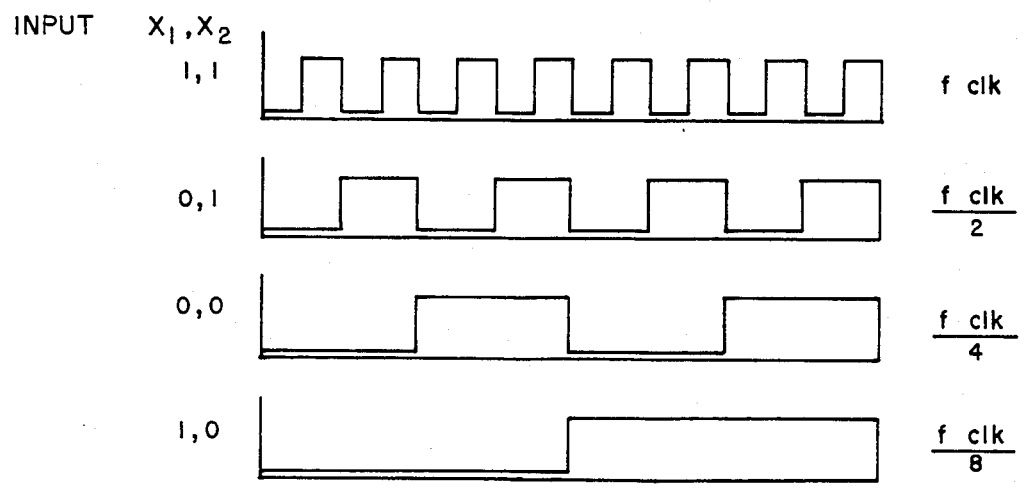
FIG. 7 is a graphical illustration of the signal wave forms used for testing the invention.

This second method may be further improved by taking advantage of the regular nature of the properly sequenced truth-table. The nodes of the three input gate structure are two input gates that may be clocked through sixteen functions sequentially and at any speed up to the maximum clock frequency. The function sequence has been mapped to produce output signals appearing as shown in FIG. 7 at Z for each of the specified input conditions when continuously clocked. The characteristic frequency of the Z output may thus be used to verify correct node performance through the use of the continuous clock signal, various input bit patterns and a frequency spectrum detector. This pattern recognition approach, which comprises the third method mentioned above, and the inventive test method of the present invention, reduces the steps needed to evaluate a three-variable input gate structure of the present invention to 24. This dynamic method is a powerful new approach to the evaluation of a gate structure. The utility of the method becomes even more apparent when a four input ten node gate structure of the present invention is considered. (See Table II)

TABLE II

| INPUT VARIABLES | NODES | BASIC TEST STEPS METHOD | | |
|---|---|---|---|---|
| | | 1 | 2 | 3 |
| N=3 | 6 | 2048 | 384 | 24 |
| N=4 | 10 | $1.04 \times 10^6$ | 640 | 40 |

The four-variable input ten gate logic structure in accordance with the present invention will permit $2^{16}$ truth-tables and with $2^4$ input options, requires $2^{20}$ or $1.04 \times 10^6$ steps. Thus the static-dynamic approach of this inventive method is a substantially more efficient means for rapid and thorough testing of regular architectured gate structures.

Figure 8:
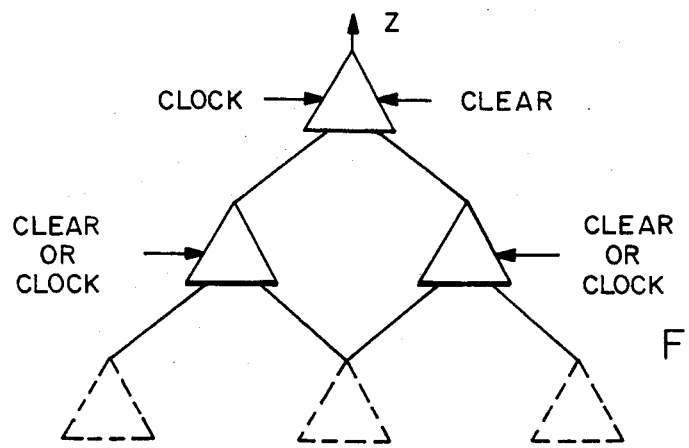
FIG. 8 is a graphical block diagram illustration of the gate structure of the invention which is used to explain the test method of the present invention.

Referring back to the three input gate structure of FIG. 2, the regular hierarchial architecture of the three-variable input gate permits the top-down evaluation of each node or atom until the six node structure is tested and verified. The PLA 42 has been structured such that a CLEAR to any node established the Boolean expression Z=1 at its output. This case along with the other trivial case Z=0 is used as a source of test signals within the three-variable input gate structure. Within the hierarchy, any given atom may be presented with input signals that are known with reasonable certainty. The logical one output from the node below the one under test is established by a CLEAR signal and a 0 logic output by a one clock cycle (a negative going transition on the clock input). The top node is tested by the architecturally determined connection scheme of FIG. 8. CLOCK or CLEAR signals on the two second tier nodes of the three input gate structure shown in FIG. 8 serve to provide logical inputs of (1,1), (1,0), (0,1), (0,0) as desired. This general approach is used to evaluate each node in a multi-variable input gate. The evaluation of any node is performed by logical operations on the CLEAR and CLOCK inputs to the node under test. These control inputs are organized to allow ready access to all possible functions or combinational possibilities for a two-variable input gate. Thus, with all input possibilities and all logical possibilities a node can be completely evaluated.

In accordance with the previous discussion, the node under test is clocked at a convenient rate, the output wave form at Z is monitored and the visual pattern recognition of an operator will be utilized to detect irregularities in the output wave form. The test procedure is outlined in Table III.

TABLE III

| | | INPUTS TO NODE UNDER TEST | | |
|---|---|---|---|---|
| | | X1 | X2 | $f_Z$ expected |
| 1.0 | Start | | | |
| 1.1 | Clear all nodes | 1 | 1 | |
| 1.1.2 | Clock by 1 to no child | 1 | 1 | |
| 1.1.3 | Clock node under test evaluate $f_Z$ | | | f clk |
| 1.2 | Clear all nodes | 1 | 1 | |
| 1.2.2 | Clock by 1 to right child | 1 | 0 | |
| 1.2.3 | Clock node under test evaluate $f_Z$ | | | $\dfrac{f\ clk}{8}$ |
| 1.3 | Clear all nodes | 1 | 1 | |
| 1.3.2 | Clock by 1 to left child | 0 | 1 | |
| 1.3.3 | Clock node under test evaluate $f_Z$ | | | $\dfrac{f\ clk}{2}$ |
| 1.4 | Clear all nodes | 1 | 1 | |
| 1.4.2 | Clock by 1 to right and and left child | 0 | 0 | |
| 1.4.3 | Clock node under test evaluate $f_Z$ | | | $\dfrac{f\ clk}{4}$ |

The above procedure is suited to the top or number one node of the three-variable input gate. When that test is complete, the next layer, nodes 2 and 3, is evaluated with node 1 set to either Z=X1 or Z=X2 as appropriate. These settings of the "proven" node are made by a train of clock pulses of 10 transitions after a CLEAR for a Z=X1 and 4 transitions for Z=X2. These steps are inserted into the test procedure as follows:

TABLE IV

| 2.0 | START |
|---|---|
| 2.1 | Clear all nodes |
| 2.1.1 | Set parent to Z=X1 ( or X2) |
| 2.1.2 | Clock by 1 to no child |
| 2.1.3 | Clock node under test and evaluate $f_Z$ |

By this scheme any node can access the three-variable input gate output port Z to permit evaluation of its clock wave form. The bottom row of nodes, 4, 5 and 6 are tested in the same manner as the upper nodes. Here however there are no additional child nodes under the lowest tier of nodes of the three-variable input gate. Thus, in order to maintain the test procedure, data must be placed on the four input terminals. The full test procedure works top-down in the three-variable input gate to test each node. The node under test is clocked continuously. The child nodes are cleared or clocked to logical one to establish input logic. Parent nodes are said to be transparent by four or ten clock transitions. The entire three input gate can thus be evaluated and 6×4 inspections of Z reveals the entire logical profile of the device. The 24 truth-table excursions are organized into a graphic display with a high degree of visual regularity. Anomalies in the clock scan of the logic functions appear as irregularities in the display.

Figure 9:
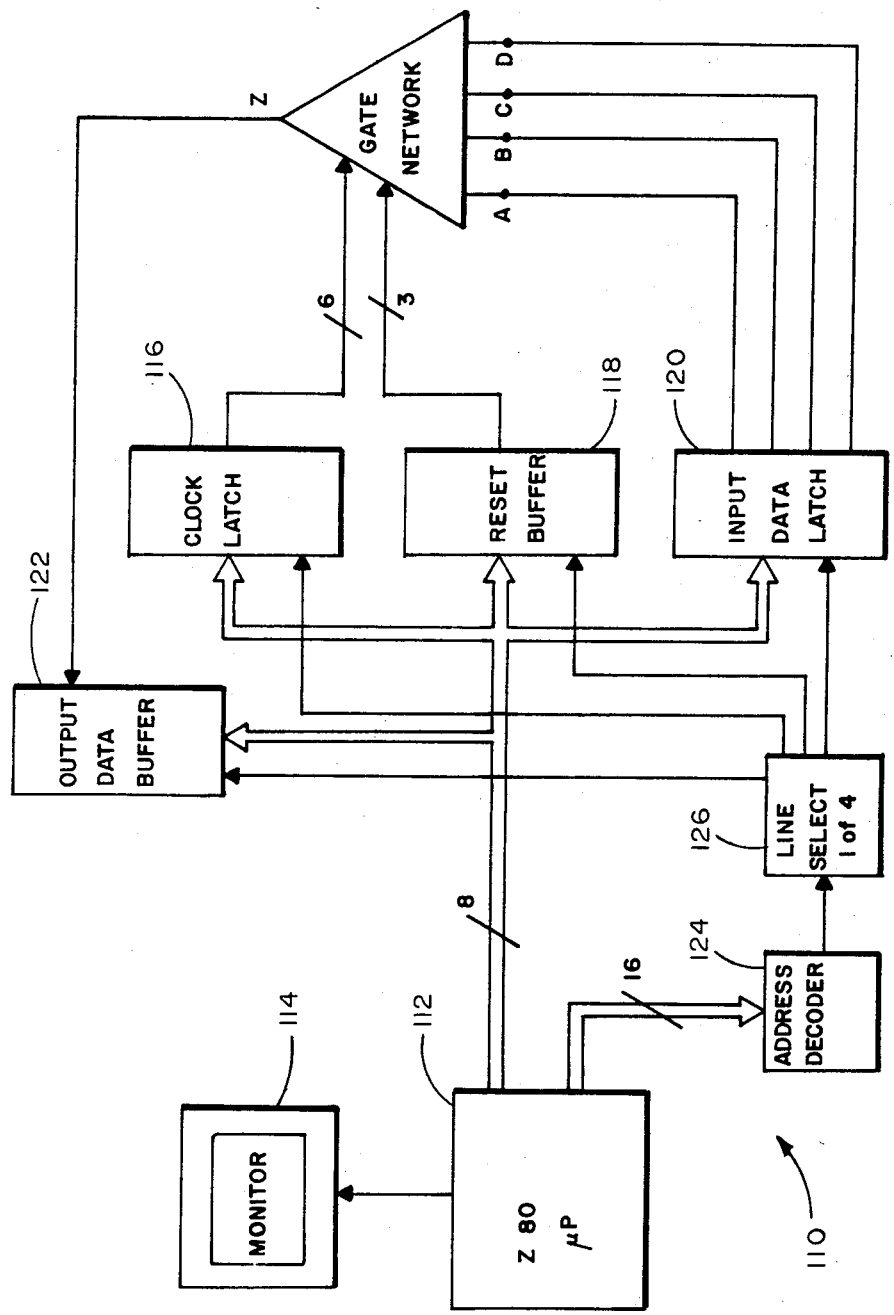
FIG. 9 is a block diagram representation of the apparatus used for carrying out the novel test method of the present invention.

The test procedure described above may be implemented by a simple test apparatus 110 shown in FIG. 9 and comprising a microprocessor controller and a graphic display. The test apparatus is configured as a parallel I/O port interfacing with a Z80 based microprocessor 112. The microprocessor stores the test program, manipulates the data set for the three-variable input gate structure under test and collects and stores the resultant patterns from the gate structure's Z output. The microprocessor also manages a monitor display 114. Other types of monitors can, of course, be used.

In a particular embodiment of the test apparatus shown in FIG. 9 a Z80 microprocessor based Sinclair Model ZX81 computer was used for this task. The basic language interpreter and the graphics characters that are stored in the ROM of the Sinclair ZX81 computer were utilized in the test program. The tester is parallel connected to the Z80 data bus to form input commands and to add words to the bus from the logic gate output. The data bus is interfaced by six latches and three tri-state buffers. These devices are strobed by a memory-map address decoder circuit. A six-bit word is latched as a set of clocks by clock latch 116. One bit is assigned to each of the six nodes in the device under test. The most significant bit forms the clock for the highest level, number one node and the least significant bit forms the clock for one of the lowest level nodes. Because the particular embodiment of the integrated circuit chip hosts two complete three-variable input gate structures and each gate structure is to be clocked with its own word, two six-bit latches are required. The three-bit word is acquired from the data bus by a reset buffer 118 to form a set of CLEAR commands. The individual clear connections to each node are connected together to form a layer of clearing capability. This reduction of the number of CLEAR signals required from the tester was made in order to reduce the hardware complexity. With three-bit clear words, both halves of the chip can be accommodated in one clear or reset command of six bits. A four-bit word is latched by input data latch 120 for the input data to each three-variable input gate structure. The resultant eight-bit word is accommodated by a single command from the Z80 microprocessor.

Data is read from the circuit under test by an output buffer 112 upon command from the microprocessor 112. The least significant bit read is the state of one Z output of one of the two three-variable input logic structures and the next bit is the state of the other three-variable input gate logic structure. Both outputs are read in the resultant two-bit word. This provision permits detection of possible anomalous operations from the gate structure that is not under test but that shares the same device chip.

Strobe commands to the latches and buffers are produced by the memory-mapped address decoder 124 and a line selector circuit 126. The one-of-four line selector circuit 126 produces four write strobe commands and four read strobe commands. The write strobes are: CLOCK for each three-variable input gate structure, CLEAR and ENTER DATA WORD. Only a read strobe is necessary to determine the output states of the two gate structures. A Basic program that follows the test procedure outlined above is indicated below in Table V.

TABLE V

| | |
|---|---|
| 2 | REM "TEST CHIP" |
| 3 | REM <SELECT CHIP A OR B> |
| 4 | PRINT "TEST CHIP SIDE A OR B ?" |
| 5 | PRINT |
| 6 | INPUT X$ |
| 8 | IF X$="B" THEN GOTO 3000 |
| 10 | LET A=16378 |
| 14 | LET C=16379 |
| 16 | LET D=16376 |
| 18 | LET R=0 |
| 20 | LET S=0 |
| 22 | LET L=0 |
| 24 | LET M=0 |
| 98 | REM <ATOM TEST> |
| 100 | GOSUB 1500 |
| 110 | POKE A,L |
| 120 | GOSUB 1000 |
| 130 | POKE A,M |
| 140 | GOSUB 1000 |
| 150 | GOTO 110 |
| 198 | REM <SELECT ATOM 2> |
| 200 | FOR N=1 TO 2 |
| 202 | POKE A,32 |
| 206 | POKE A,0 |
| 210 | NEXT N |
| 212 | LET L=16 |
| 214 | LET M=0 |
| 216 | GOTO 110 |
| 220 | FOR N=1 TO 2 |
| 222 | POKE A,32 |
| 226 | POKE A,0 |
| 230 | NEXT N |
| 232 | LET L=20 |
| 234 | LET M=4 |
| 236 | GOTO 110 |
| 240 | FOR N=1 TO 2 |
| 242 | POKE A,32 |
| 246 | POKE, A,0 |
| 250 | NEXT N |
| 252 | LET L=22 |
| 254 | LET M=6 |
| 256 | GOTO 110 |
| 260 | FOR N=1 TO 2 |
| 262 | POKE A,32 |
| 266 | POKE, A,0 |
| 270 | NEXT N |
| 272 | LET L=18 |
| 274 | LET M=2 |
| 276 | GOTO 110 |
| 278 | REM <SELECT ATOM 3> |
| 280 | FOR N=1 TO 5 |
| 282 | POKE A,32 |
| 286 | POKE A,0 |
| 290 | NEXT N |
| 292 | LET L=8 |
| 294 | LET M=0 |
| 296 | GOTO 110 |
| 300 | FOR N=1 TO 5 |
| 302 | POKE A,32 |
| 306 | POKE A,0 |
| 310 | NEXT N |
| 312 | LET L=10 |
| 314 | LET M=2 |
| 316 | GOTO 110 |
| 320 | FOR N=1 TO 5 |
| 322 | POKE A,32 |
| 326 | POKE A,0 |
| 330 | NEXT N |
| 332 | LET L=11 |
| 334 | LET M=3 |
| 336 | GOTO 110 |
| 340 | FOR N=1 TO 5 |
| 342 | POKE A,32 |
| 346 | POKE A,0 |
| 350 | NEXT N |
| 352 | LET L=9 |
| 354 | LET M=1 |
| 356 | GOTO 110 |
| 358 | REM <SELECT ATOM 4> |
| 360 | POKE D,255 |

TABLE V-continued

| | |
|---|---|
| 361 | FOR N=1 TO 2 |
| 362 | POKE A,32 |
| 363 | POKE A,O |
| 364 | NEXT N |
| 366 | FOR N=1 TO 5 |
| 368 | POKE A,16 |
| 369 | POKE A,O |
| 370 | NEXT N |
| 374 | LET L=4 |
| 376 | LET M=O |
| 378 | GOTO 110 |
| 380 | POKE D,32 |
| 382 | GOTO 361 |
| 400 | POKE D,O |
| 402 | GOTO 361 |
| 420 | POKE D,16 |
| 422 | GOTO 361 |
| 438 | REM <SELECT ATOM 5> |
| 440 | POKE D,255 |
| 441 | FOR N=1 TO 2 |
| 442 | POKE A,48 |
| 443 | POKE A,O |
| 444 | NEXT N |
| 454 | LET L=2 |
| 456 | LET M=O |
| 458 | GOTO 110 |
| 460 | POKE D,68 |
| 462 | GOTO 441 |
| 480 | POKE D,O |
| 482 | GOTO 441 |
| 500 | POKE D,34 |
| 502 | GOTO 441 |
| 518 | REM <SELECT ATOM 6> |
| 520 | POKE D,255 |
| 521 | FOR N=1 TO 5 |
| 522 | POKE A,32 |
| 523 | POKE A,O |
| 524 | NEXT N |
| 526 | FOR N=1 TO 2 |
| 528 | POKE A,8 |
| 530 | NEXT N |
| 534 | LET L=1 |
| 536 | LET M=O |
| 538 | GOTO 110 |
| 540 | POKE D,136 |
| 542 | GOTO 521 |
| 560 | POKE D,O |
| 562 | GOTO 521 |
| 580 | POKE D,68 |
| 582 | GOTO 521 |
| 998 | REM <GRAPHICS COLUMN> |
| 1000 | IF PEEK D=3 THEN LET T$=" " |
| 1002 | IF PEEK D=2 THEN LET T$="*" |
| 1004 | IF PEEK D=1 THEN LET T$="+" |
| 1006 | IF PEEK D=0 THEN LET T$="-" |
| 1020 | PRINT AT R,S;T$ |
| 1025 | IF R=15 THEN GOTO 2000 |
| 1030 | LET R=R+1 |
| 1040 | RETURN |
| 1048 | REM <BLANK COLUMN> |
| 1050 | PRINT AT R,S; " " |
| 1052 | IF R=15 THEN GOTO 2000 |
| 1054 | LET R=R+1 |
| 1056 | GOTO 1050 |
| 1500 | REM <INITIALIZE CHIP> |
| 1530 | POKE 16378,0 |
| 1540 | POKE 16377,0 |
| 1550 | POKE D,O |
| 1560 | POKE C,255 |
| 1598 | REM <SELECT ATOM 1> |
| 1600 | IF S=0 THEN LET L=32 |
| 1601 | IF S=0 THEN LET M=O |
| 1602 | IF S=7 THEN LET L=40 |
| 1603 | IF S=7 THEN LET M=8 |
| 1604 | IF S=14 THEN LET L=56 |
| 1605 | IF S=14 THEN LET M=24 |
| 1606 | IF S=21 THEN LET L=48 |
| 1607 | IF S=21 THEN LET M=16 |
| 1608 | REM <SELECT ATOMS 2,3,4,5,6> |
| 1610 | IF S=1 THEN GOTO 200 |
| 1612 | IF S=8 THEN GOTO 220 |
| 1614 | IF S=15 THEN GOTO 240 |
| 1616 | IF S=22 THEN GOTO 260 |
| 1618 | IF S=2 THEN GOTO 280 |
| 1620 | IF S=9 THEN GOTO 200 |
| 1622 | IF S=16 THEN GOTO 320 |
| 1624 | IF S=23 THEN GOTO 340 |
| 1626 | IF S=3 THEN GOTO 360 |
| 1628 | IF S=10 THEN GOTO 340 |
| 1630 | IF S=17 THEN GOTO 400 |
| 1632 | IF S=24 THEN GOTO 420 |
| 1634 | IF S=4 THEN GOTO 440 |
| 1636 | IF S=11 THEN GOTO 460 |
| 1638 | IF S=18 THEN GOTO 480 |
| 1640 | IF S=25 THEN GOTO 500 |
| 1642 | IF S=5 THEN GOTO 520 |
| 1644 | IF S=12 THEN GOTO 540 |
| 1646 | IF S=19 THEN GOTO 560 |
| 1648 | IF S=26 THEN GOTO 580 |
| 1678 | REM <SELECT BLANK COLUMN> |
| 1680 | IF S=6 THEN GOTO 1050 |
| 1682 | IF S=13 THEN GOTO 1050 |
| 1684 | IF S=20 THEN GOTO 1050 |
| 1700 | RETURN |
| 1998 | REM <SELECT COLUMN POSITION> |
| 2000 | LET S=S+1 |
| 2014 | LET R=O |
| 2020 | IF S=27 THEN GOTO 2040 |
| 2030 | GOTO 1500 |
| 2040 | PRINT |
| 2044 | PRINT "123456 123456 123456 123456 ATOM" |
| 2046 | PRINT |
| 2048 | PRINT "(1,1) (0,1) (0,0) (1,0) INPUT" |
| 2050 | STOP |
| 2998 | REM <SELECT B CHIP> |
| 3000 | LET A=16377 |
| 3002 | GOTO 12 |

Figure 10:
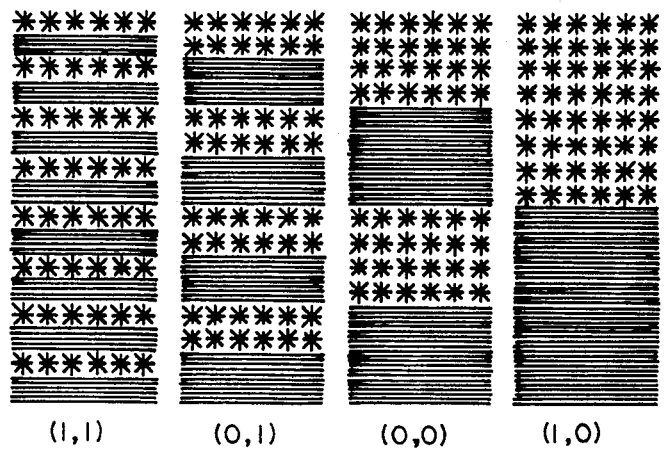
FIGS. 10, 11, 13 and 15-17 are illustrations of the video monitor representations of the test results produced in carrying out the test method of the present invention.

The test procedure involves configuring a node with specific inputs and then cycling the node through its sixteen logical states. Since each node has the same response to a given input state, the output data collected from each node can be organized into sets defined by the input states. The program produces a graphic display of each set of Z responses in a pattern that reveals the actual bit code. Anomalous responses are detected by presenting the observer with a regular pattern for correct data. The human skill for detecting pattern irregularities may be exploited to expose subtle fault conditions. Of course, pattern recognition devices can be substituted for a human observer. FIG. 10 shows the columns of truth-table data arranged in sets defined by data input states. Hatched pixels represent a logical 1. Such pixels are represented in FIGS. 10, 11, 13, 15, 16 and 17 as closely spaced horizontal lines. A star symbol is a logical 0 for one of the two three input gate structures and a + symbol is a logical 0 for the other gate structure. The two logical 0 symbols serve to indicate which gate structure is being tested while also producing a clear statement on the logical states of each output. The truth-table for the display is as follows:

TABLE VI

| DATA WORD | SYMBOL |
|---|---|
| 00000000 | − |
| 00000001 | + |
| 00000010 | * |
| 00000011 | |

The nomral state for Z for the three-variable input gate structure not under test is CLEAR to a logical 1. In this case a star and a minus sign represent the logical 0 for the two sides of a chip. Should side A number 1 node not clear to a logical 1, then side B symbols will become star for a logical 1 and minus for a logical 0. If side B fails to clear its number 1 node to produce a logical 1 then side A symbols will become plus for a logical 1 and minus for a logical 0. The left-most 6×16 matrix of the display (see FIG. 10) illustrates the result of testing the six nodes with their input states set at 1,1. The next matrix displays results for inputs of 0.1 and results for 0,0 and 1,0 follow.

ACTUAL TEST RESULTS

The novel test method of the present invention was applied to selected examples of correctly operating and faulty operating dual three-variable input logic gate structures in the form of VLSI integrated circuit chips of 2.0 micron geometry. As seen in FIG. 10 the sixteen possible logical operation by a two-variable input node are presented as columns of graphical symbols. The symbols are grouped by node input state. The four possible input states produce four matrices. Since each node is identical, a fault-free three-variable input logic gate structure will produce the four patterns shown in FIG. 10. The graphical symbols illustrate that this was a fault-free pattern indication for side A of a dual chip.

Figure 11:
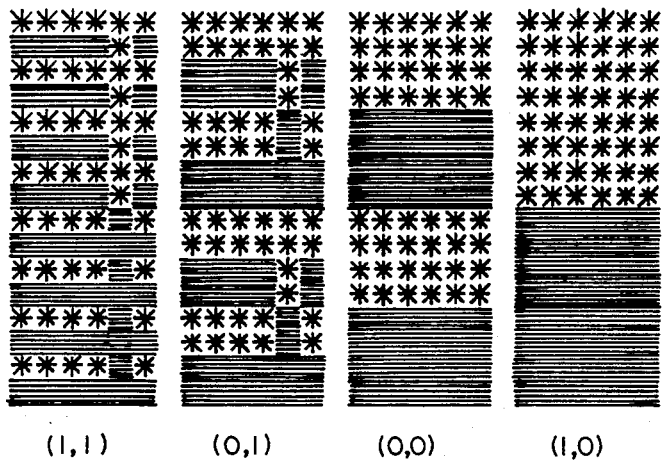
Figure 12:
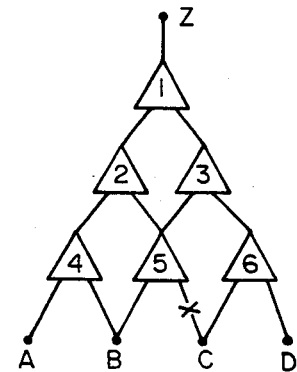
FIGS. 12 and 14 are graphical block diagram illustrations of a gate structure of the present invention used to illustrate examples of faults detected by carrying out the test method of the invention.
Figure 13:
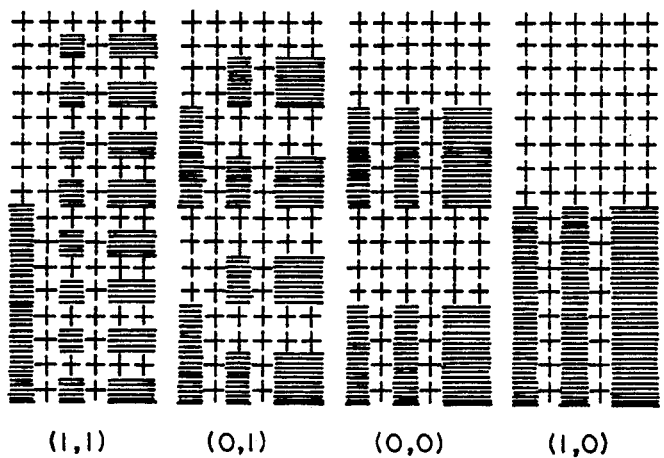

FIG. 11 represents an abnormal truth-table presentation that implicates node No. 5 as being faulty. The fault was predicted from the visual representation to be a break in the circuit connecting node 5 to the bonding pad. The reasoning was based upon the observation that node 5 responded to the (1,1) input case as if (1,0) was present and to the (0,1) case as if (0,0) was present. The consistent absence of the second bit as an input to node 5 only, (nodes 4 and 6 being normal) suggested a localized disconnection. Microscopic analysis verified the logical analysis revealing a missing contact cut to the metal run from node 5 input to the chip pin as illustrated in FIG. 12. It will be noted that in FIGS. 12 and 14 input A is not connected to input D as discussed above for FIG. 2. This is merely a convenience and does not affect the test procedure which can be conducted on either configuration.

Figure 14:
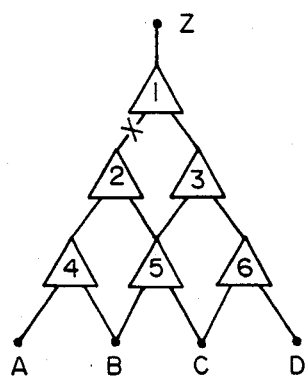
Figure 15:
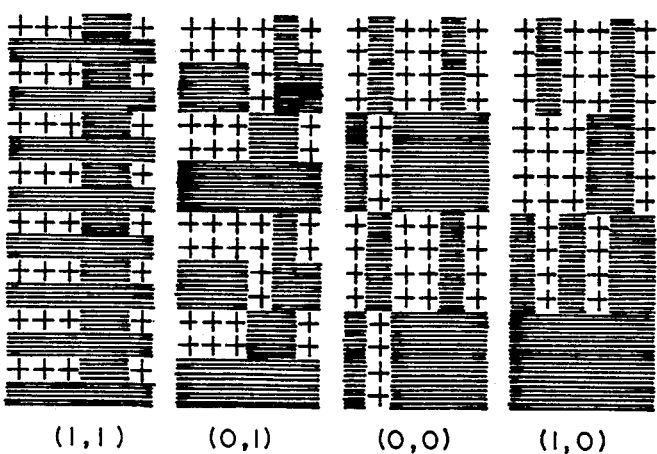

As another example of fault detection provided by the test method of the present invention, a video presentation of side B (indicated by the plus sign used for logical 1) indicated an abnormal truth-table presentation. Nodes 1, 2 and 4 were implicated as being at fault. The fault was predicted to be a gap in the circuit between nodes 1 and 2. Node 1 itself was not deemed to be faulty because it appeared to perform normally for the pathway 3, 5 and 6. Node 1 performance suggested that node 2 produced only a logical 0 because of a break in the circuit connecting node 2 to node 1. Microscopic analysis verified the logical analysis by revealing a 1 micron gap in the diffusion trace at a computer-aided-design software cell boundary between nodes 2 and 1 as shown in FIG. 14. The known fault was repaired and retest of the same side of that chip showed continued abnormal operation and produced a set of patterns illustrated in FIG. 15. Based on this subsequent truth-table presentation an additional fault was predicted to be improper clearing action in node 2. Nodes 2, 4 and 5 are implicated in faulty operation. Two possibilities were under consideration at the time this test was conducted, namely, a defective clearing operation and clearing to an unexpected function position.

Figure 16:
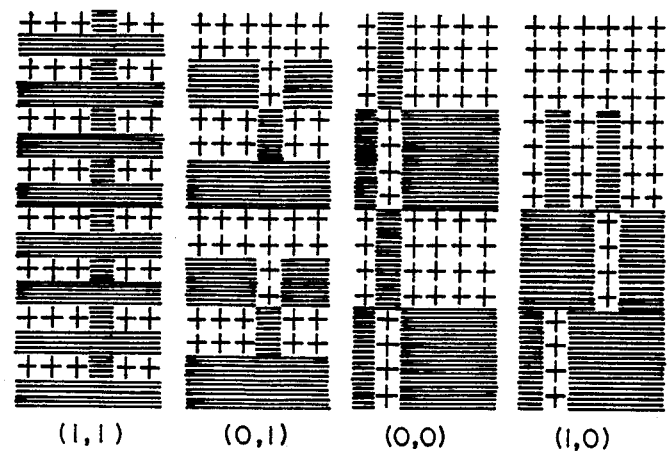
Figure 17:
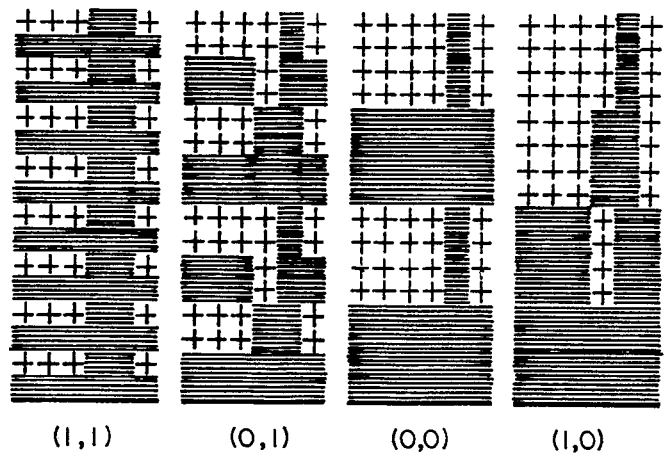

FIGS. 16 and 17 illustrate other examples of faulty operation of side B of a dual chip three-variable input logical gate structure employing the test method of the present invention. Logical analysis and microscopic examination for corroboration of fault prediction capabilities for these two fault patterns are under current consideration.

It will now be understood by those having skill in the art to which the present invention pertains that the applicant herein has disclosed a fully testable multiple input gate utilizing a novel test method in which all internal logic components can be fully tested in a simple and highly expedient manner. In one illustrative embodiment of the apparatus of the present invention, the logic structure comprises a combinatorial logic device in the form of a complete gate structure constructed from six two input gates configured in hierarchial form. The result is a logically complete field programmable logic structure that may be configured into all of the possible 256 functions of a three input device. Each of the six two input gates, referred to herein as a node or atom, provides for two variable inputs and four control inputs. Testability is provided by modifying only the control structure. A test algorithm may be incorporated for each atom or for all atoms by a four-bit bus from a central test location in a signal generator such as a PLA memory device.

The testability of the invention herein disclosed comprises a novel dynamic test method which is deemed to be a powerful new approach to the evaluation of gate structures. The regular hierarchial architecture of the invention permits top-down evaluation of each atom until the six node structure is tested and verified. The test is implemented by a microprocessor controller and display monitor that permits the use of a pattern recognition analysis of the gate structure output to verify logic correctness or to provide prediction capability for fault detection. A number of examples of such fault detection capability have been disclosed herein.

It will also be understood as a result of the teaching of the applicant herein disclosed that the present invention provides a novel state machine logic device which comprises an array of complete atoms. Each atom provides means for generating all possible Boolean output functions of the input variables. The combinatorial logic device of the invention is amenable to full testability and irrespective of the technology in which it is implemented including VLSI, the device can be completely tested while overcoming the conventional "buried logic" problem of the prior art. The device is specifically amenable to full testability by a novel test method which significantly reduces the longevity and complexity of the test while still assuring functional assessment of all logical components contained therein. Although the test method of the invention may have applications outside of the specific logic gate structure disclosed herein, the method is especially suitable for testing the field programmable multiple input variable logic gate of which one embodiment is disclosed herein. As a result of the novel teaching herein disclosed, those having skill in the art to which the invention pertains will now comprehend various modifications and additions that may be made to the circuit and test method of the present invention. By way of example, gate structures that provide for additional input variables in accordance with the invention may now occur to those of relevant skill. However, all such modifications and additions are contemplated to be within the scope of the present invention which is limited only by the claims appended hereto.

I claim:

1. A logic gate structure having a plurality of data inputs and a data output and comprising:

a plurality of interconnected replicated multi-variable data input nodes, each such node having a plurality of control input lines for selecting operation of said node in accordance with any one of all possible Boolean logic functions for the number of variables;

a plurality of memory devices, at least one such memory device being associated respectively with each such node and being connected to said node control input lines for selecting said node operation;

a plurality of registers, at least one such register being associated respectively with each such memory device for sequentially selecting the output of said memory device for application to said node control lines; and means for sequentially applying selected binary signals to said registers and to said nodes for exhaustively testing each node of said logic gate structure;

said plurality of nodes being configured in a hierarchial array comprising a single node top layer and a plurality of successively lower layers, each such lower layer having more nodes than the top layer, the top layer data output being the data output of said gate structure, the lowest layer data inputs being the data inputs to said gate structure, each layer above said lowest layer being configured to receive data inputs only from the immediately lower layer.

2. The logic gate structure recited in claim 1 further comprising:
means for monitoring the output of said logic gate structure for assessing said structure's performance during testing.

3. The logic gate structure recited in claim 1 further comprising:
a clock signal source connected to each of said registers for sequentially changing said output of each of said memory devices at a selected clock frequency.

4. The logic gate structure recited in claim 1 wherein said structure comprises a portion of a VLSI integrated circuit chip, said chip also accommodating at least an additional one of said logic gate structures.

5. The logic gate structure recited in claim 1 further comprising:
means for selectively fixing all of said memory devices for respective application of constant output signals to said control lines for selecting any one of the possible Boolean logic functions for the number of variable signals input to said logic gate structure.

6. The logic gate structure recited in claim 1 further comprising:
means for displaying the output of said logic gate structure for assessing said structure's performance during testing.

7. The logic gate structure recited in claim 1 further comprising:
means for displaying matrix presentations of the output of said logic gate structure for analyzing the fault status of the respective nodes of said logic gate structure during testing.

8. A three-variable data input logic gate structure comprising:
a plurality six replicated two-variable data input nodes, each such node having four control input lines for selecting operation of said node in accordance with any one of the sixteen Boolean logic functions for two variables;

a plurality of memory devices, at least one such memory device being associated respectively with each such node and being connected to said node control input lines for selecting said node operation;

a plurality of registers, at least one such register being associated respectively with each such memory device for sequentially selecting the output of said memory device for application to said node control lines; and means for sequentially applying selected binary signals to said registers and to said nodes for exhaustively testing each node of said logic gate structure;

said nodes being configured in a hierarchial array comprising a single node top layer and a plurality of successively lower layers, each such lower layer having more nodes than the top layer, the top layer data output being the data output of said gate structure, the lowest layer data inputs being the data inputs to said gate structure, each layer above said lowest layer being configured to receive data inputs only from the immediately lower layer.

9. The logic gate structure recited in claim 8 further comprising:
means for monitoring the output of said logic gate structure for assessing said structure's performance during testing.

10. The logic gate structure recited in claim 8 further comprising:
a clock signal source connected to each of said registers for sequentially changing said output of each of said memory devices at a selected clock frequency.

11. The logic gate structure recited in claim 8 wherein said structure comprises a portion of a VLSI integrated circuit chip, said chip also accommodating at least an additional one of said logic gate structures.

12. The logic gate structure recited in claim 8 further comprising:
means for selectively fixing all of said memory devices for respective application of constant output signals to said control lines for selecting any one of the possible Boolean logic functions for the number of variable signals input to said logic gate structure.

13. The logic gate structure recited in claim 8 further comprising:
means for displaying the output of said logic gate structure for assessing said structure's performance during testing.

14. The logic gate structure recited in claim 8 further comprising:
means for displaying matrix presentations of the output of said logic gate structure for analyzing the fault status of the respective nodes of said logic gate structure during testing.

15. A method of testing a logic gate structure, the gate structure of the type having a hierarchial array of replicated multi-variable input nodes, each such node having a plurality of control input lines for selecting operation of said node in accordance with any one of a plurality of Boolean logic functions; the method comprising the following steps:
a. forcing the child nodes of a selected node to sequentially provide all combinations of logical inputs possible to the selected node,
b. forcing the selecting node to sequentially provide all possible functions for the provided logical inputs, c. clocking the control input lines of the selected node and its child nodes at a synchronous fixed rate, d. controlling the logical truth values of the signals applied to said control input lines to produce a pre-determined sequence of output signals of said logic gate structure, e. applying said pre-determined sequence of output signals to a display device for display of a matrix of symbols representing the logical truth values of said output signals for the respective functions and logical inputs of said selected node, and f. repeating steps a. through e. for each of the remaining nodes of said logic gate structure in a pre-determined node sequence.

16. The method of testing recited in claim 15 further comprising the steps of:

g. maintaining the display of output signals of all nodes simultaneously after completion of steps a. through g. to provide a combined display matrix pattern of all nodes, and h. observing the pattern produced in step g. to assess whether or not the logic gate structure being tested is faulty.

17. The method of testing recited in claim 16 further comprising the step of:

i. determining the cause of a fault observed during step h.

18. A method of testing a three-variable input logic gate structure, the gate structure of the type having a hierarchial array of six replicated two variable input nodes, each such node having four control input lines for selecting operation of said node in accordance with any one of the sixteen possible Boolean logic functions for two input variables, the method comprising the following steps:

a. forcing the child nodes of a highest order node to sequentially provide all combinations of logical inputs possible to the highest order node, b. forcing the selecting node to sequentially provide all possible functions for the provided logical inputs, c. clocking the control input lines of the highest order node and its child nodes at a synchronous fixed rate, d. controlling the logical truth values of the signals applied to said control input lines to produce a pre-determined sequence of output signals of said logic gate structure, e. applying said pre-determined sequence of output signals to a display device for display of a matrix of symbols representing the logical truth values of said output signals for the respective functions and logical inputs of said highest order node, and f. repeating steps a. through e. for each of the remaining nodes of said logic gate structure in a pre-determined node sequence.

19. The method of testing recited in claim 18 further comprising the steps of:

g. maintaining the display of output signals of all nodes simultaneously after completion of steps a. through g. to provide a combined display matrix pattern of all nodes, and h. observing the pattern produced in step g. to assess whether or not the logic gate structure being tested is faulty.

20. The method of testing recited in claim 19 further comprising the step of:

i. determining the cause of a fault observed during step h.

21. A logical gate structure having a minimum of three data input variables and being particularly amenable to full component level testing, the gate structure comprising:

a plurality of interconnected replicated atoms, each such atom having a plurality of directly accessible control input lines for selecting a logic function in accordance with any one of all possible Boolean logic functions for the number of variables input to the atom;

means for generating signals to be applied to each atom on said control lines for limiting logic operation in accordance with a selected function for each said atom; and control means connected to said generating means for applying generated signals to each said atom in a predetermined sequence for exhaustively testing each and every atom of said gate structure;

said plurality of atoms being configured in a hierarchial array comprising a single atom top layer and a plurality of successively lower layers, each such lower layer having more atoms than the top layer, the top layer data output being the data output of said gate structure, the lowest layer data inputs being the data inputs to said gate structure, each layer above said lowest layer being configured to receive data inputs only from the immediately lower layer.

22. The logic gate structure recited in claim 21 further comprising:

means for monitoring the output of said logic gate structure for assessing said structure's performance during testing.

23. The logic gate structure recited in claim 21 further comprising:

a clock signal source connected to said control means for sequentially changing said output of said generating means at a selected clock frequency.

24. The logic gate structure recited in claim 21 wherein said structure comprises a portion of a VLSI integrated circuit chip, said chip also accommodating at least an additional one of said logic gate structures.

25. The logic gate structure recited in claim 21 further comprising:

means for selectively fixing said generating means for respective application of constant output signals to said control lines for selecting any one of the possible Boolean logic functions for the number of variable signals input to said logic gate structure.

26. The logic gate structure recited in claim 21 further comprising:

means for displaying the output of said logic gate structure for assessing said structure's performance during testing.

27. The logic gate structure recited in claim 21 further comprising:

means for displaying matrix presentations of the output of said logic gate structure for analyzing the fault status of the respective nodes of said logic gate structure during testing.

28. A method for testing a logical gate structure having a minimum of three input variables, the gate structure of the type having: a plurality of interconnected atoms, each such atom having a plurality of control input lines for selecting a logic function in accordance with any one of all possible Boolean logic functions for the number of variables input to the atom; means for generating signals to be applied to each atom on the control lines for limiting logic operation in accordance with a selected function for each atom; and control means connected to the generating means for applying generated signals to each atom in a predetermined sequence; the method comprising the following steps:

a. forcing the atoms connected to a selected atom's input lines to sequentially provide all combinations of logical inputs possible to the selected atom, b. forcing the selected atom to sequentially provide all possible functions for the provided logical inputs, c. clocking the control input lines of the selected atom and of its input atoms at a synchronous rate, d. controlling the logical truth values of the signals applied to said control input lines to produce a predetermined sequence of output signals of said logic gate structure, e. applying said predetermined sequence of output signals to a monitoring device for monitoring the logical truth values of said output signals for the respective functions and logical inputs of said selected atom, and f. repeating steps a. through e. for each of the remaining atoms of said logic gate structure in a predetermined sequence.

29. The method of testing recited in claim 21 further comprising the steps of:

g. maintaining the monitoring of output signals of all nodes simultaneously after completion of steps a. through g. to provide a combined monitoring matrix pattern of all nodes, and h. observing the pattern produced in step g. to assess whether or not the logic gate structure being tested is faulty.

30. The method of testing recited in claim 29 further comprising the step of:

i. determining the cause of a fault observed during step h.

* * * * *